(12) United States Patent
Wang et al.

(10) Patent No.: US 6,501,571 B1
(45) Date of Patent: Dec. 31, 2002

(54) THREE-DIMENSIONAL HOLOGRAPHIC STAMPING OF MULTI-LAYER BIT-ORIENTED NON-LINEAR OPTICAL MEDIA

(75) Inventors: Mark Wang, San Diego; Sadik Esener, Solana Beach, both of CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 09/547,396

(22) Filed: Apr. 11, 2000

Related U.S. Application Data
(60) Provisional application No. 60/128,990, filed on Apr. 12, 1999.

(51) Int. Cl.[7] .................................................. G03H 1/20
(52) U.S. Cl. ............................. 359/12; 359/10; 359/22; 359/24
(58) Field of Search ............................. 359/10, 12, 22, 359/24

(56) References Cited

U.S. PATENT DOCUMENTS

| | | | | |
|---|---|---|---|---|
| 5,096,790 A | * | 3/1992 | Monroe | 359/10 |
| 5,268,862 A | * | 12/1993 | Rentzepis | 365/151 |
| 5,416,616 A | * | 5/1995 | Jenkins | 359/10 |
| 5,422,873 A | * | 6/1995 | Kewitsch | 359/10 |
| 5,559,732 A | * | 9/1996 | Birge | 365/120 |

* cited by examiner

Primary Examiner—Cassandra Spyrou
Assistant Examiner—Leo Boutsikaris
(74) Attorney, Agent, or Firm—Fuess & Davidenas

(57) ABSTRACT

A master hologram is generated in a first optical medium by use of a plurality m of different reference beams, each beam bearing information suitably recorded in one or more of a plurality n layers of the second optical medium that are distinct from layers in which information in all other beams is suitably recorded. The generated master hologram is then used to optically holographically stamp, or record, multi-layer bit-oriented optical media by writing all n layers of the volume of the blank optical medium with m recording beams produced by simultaneously illuminating the master hologram with all m different reference beams, each illuminating reference beam being at a different reference angle and from a coherent light source which is incoherent with respect to every other illuminating reference beam. By this generating and this using a high degree of incoherency is obtained, making that during subsequent readout of a selected, focused, layer of the recorded optical medium signals from all other layers will become as background noise having nearly uniform intensity. The method requires a highly non-linear optical medium: a new dye-doped photopolymer is preferred.

30 Claims, 9 Drawing Sheets

(a)

(b)

Data storage:

Micro-component fabrication:

Layer 1

Layer 2

Layer 1

Layer 2

Table 1. SNR of one-layer and two-layer holographic elements

|         | SNR              |                   |                    |
|---------|------------------|-------------------|--------------------|
|         | 1 reference beam | 3 coherent beams  | 3 incoherent beams |
| 1-layer | 1.42             | 1.76              | 2.37               |
| 2-layer | 0.96             | 0.93              | 1.24               |

Fig. 9

THREE-DIMENSIONAL HOLOGRAPHIC STAMPING OF MULTI-LAYER BIT-ORIENTED NON-LINEAR OPTICAL MEDIA

REFERENCE TO RELATED PATENT APPLICATION

The present patent application is related to, and claims priority from, U.S. provisional patent application Ser. No. 128,990 filed Apr. 12, 1999, for DATA STAMPING FOR MULTI-LAYER OPTICAL MEMORIES to the selfsame inventors as is the present application. The present application is related to U.S. patent application Ser. No. 09/547,395 filed on an even date for THREE-DIMENSIONAL OPTICAL DATA STORAGE IN FLUORESCENT DYE-DOPED PHOTOPOLYMER, also to the same inventors. The content of the related patent application is incorporated herein by reference.

BACKGROUND OF THE INVENTION

1. Field of the Invention

The present invention generally concerns optical data storage, coherence and statistical optics, volume holographic gratings, and holographic optical elements.

The present invention particularly concerns a volume holographic element, and the use of same for the simultaneous optical stamping of data into multiple layers of a three- dimensional bit-oriented optical medium that exhibits a suitable sensitivity threshold.

2. Description of the Prior Art

2.1 Stamping of Optical Disks

Owing to the relative economy of the medium, and the ease of reproduction, optical discs are currently (circa 2000) the preferred method for distribution of large quantities of information. Computer software, music, and video are among the most popular forms of data encoded on digital optical discs.

Unfortunately, theoretical limits in terms of the capacity of the planar, single-recorded-layer, optical disc are quickly being reached. Despite the small gains that may be made from alternative laser sources and improved coding techniques, it is becoming more and more apparent that a new storage technology will be necessary as the successor to the reflective optical disc.

There are several new optical technologies currently being investigated including multi-layer reflective media, volume holography, two-photon storage, near-field recording, and others. Although many of these technologies have shown promise as being re-writable and having very high data densities, none of these technologies have retained the one main advantage of the standard optical disc which is its ease of production.

For example, some 4.7 GB of information on a Digital Versatile Disc, or DVD, is presently (circa 2000) mechanically stamped onto each disc, permitting a fabrication line to produce discs at a rate of 1 every 12 seconds. No other advanced optical storage system currently under investigation today has exhibited a mass replication process as simple and practical as that for optical discs.

2.2 Recent Developments in Volume Optical Materials

Meanwhile, recent advances in non-linear optical materials have stimulated interest in the development of three-dimensional memory technologies. In particular, demonstrations have been made using polymeric materials that exhibit a non-linear optical response for multi-layer (volumetric) data storage. See J. H. Strickler and W. W. Webb,"Three-dimensional optical data storage in refractive media by two-photon point excitation," Opt. Lett. 16, 1780-1782 (1991); S. Kawata and A. Toriumi,"Three-dimensional Optical Memory Using Photopolymer, Photorefractive Crystals, and Photochromic Materials," Proc. SPIE 3109, 174–180 (1997); and M. M. Wang and S. C. Esener,"Three-dimensional optical memory in fluorescent dye-doped photopolymer," submitted to Applied Optics (Dec. 12, 1998).

Demonstrations have been also been made of the use of polymeric materials for three-dimensional micro-component fabrication. See S. Maruo, O. Nakamura, and S. Kawata,"Three-5 dimensional microfabrication with two-photon-absorbed photopolymerization," Opt. Lett. 22, 132–134 (1997).

A key factor which will determine whether these new technologies will become practical for the mass production of memory devices that are already recorded at the time of sale will be the speed and economy at which these devices may be fabricated.

Two possible approaches to increasing the fabrication rate are, first, to increase the sensitivity of the materials to allow high speed serial raster recording of the desired data, and, second, to attempt to record data in some degree of parallelism. The present invention is concerned with second possibility, specifically with three-dimensional data stamping, meaning the recording of data in parallel into each of multiple regions, normally planes, of a three-dimensional bit-oriented volume optical medium.

Any ability to emplace voluminous digital data in parallel, and all at the same time, within the three-dimensional volume of a optical memory, normally an optical disk, as a type of"data stamping" would be very useful in many areas. Data stamping is projected to be useful for data recording in fields including (i) entertainment, such as audio, video, and multimedia information distribution, video games; (ii) computer data storage, such as software distribution, large database, data archiving, 3D video; (iii) information processing, such as image recognition, voice recognition, relational databases; and (iv) optoelectronics, such as fiber optics, free-space optics, optical processing and communication.

Additionally, if the data stamping transpires at sufficiently fine spatial resolution, and if the process is not adversely affected when extensive spatial volumes are written entirely to one binary state or the other, then data stamping can be envisioned as a means of creating three-dimensional objects, complete with cavities and voids if any be present. The object created by three-dimensional data stamping might appear, proper materials being chosen, as if encased in glass or might actually, proper materials being chosen, become separable from a surrounding"unwritten" matrix, and usable as a"formed" object.

SUMMARY OF THE INVENTION

The present invention contemplates a new 3D optical storage technology which has the potential to replace standard optical discs as the next generation of distributable optical media. The invention is manifest in a new technique by which digital data may be optically stamped, in a process called"data stamping", simultaneously into (i) bit-oriented (ii) multiple layers within (iii) the 3D volume of a volume optical memory, typically a (thick) disc. The virgin optical memory medium, prior to being data stamped, is typically as a continuum, and without any content or indexing (optical or otherwise) whatsoever. The data stamping "writes" the entire volume of the media simultaneously in one operation, leaving (most typically) multiple layers of data each of which layers is fully organized into addressable voxels.

Multi-layer volume optical memories, particularly in the form of optical discs, have the advantage of being able to significantly increase the data capacity of a single disc without incurring a large increase in access time. The technique of the present invention is directed to recording digital data just as quickly, cheaply and reliably as single-layer planar optical discs are recorded today (circa 2000). Components similar to those used in the technique of the present invention have been in use for many years, and have already been demonstrated to possess all the necessary performance requirements for use in the present invention.

1. A (i) Particular Holographic Element for (ii) Data Stamping (iii) A Volume Optical Memory Made From a Non-linear Optical Medium The present invention has several parts. In aggregate, the present invention teaches a multi-step process. First, an appropriate special holographic "data stamping" element is generated. Then, second, this generated holographic data stamping element is used and re-used for the simultaneous optical data stamping of multi-layer data into the volume of a three-dimensional optical medium. Importantly, this optical medium must, and does, exhibit a suitable non-linear response—manifested as a sharp radiation sensitivity threshold—so as to permit the recording of large numbers of data bits in parallel.

Each of the processes of (i) generating the special holographic data stamping element (and the holographic element so generated), (ii) performing the optical data stamping by use of the generated holographic element, and (iii) using an appropriately non-linear three-dimensional optical medium, constitute separate parts of the present invention.

1.1 Generating a Holographic Data Stamping Element

The (i) generating of the holographic data stamping element, and the holographic data stamping element so generated, are special both for (a) how the element is generated, and (b) what the element contains. If the holographic element is to "stamp data" in each of multiple planes, then a practitioner of the holographic arts might recognize that, by way of example, a recordable holographic material, such as the photopolymers of the DuPont Corporation specifically preferred for this task, could be and should be placed in the optical path of a 4-f imaging system, in location either before or after the image plane. The data mask of a single layer would then be recorded in the hologram. The position of the image plane would then be shifted axially and the next data mask recorded.

This rudimentary prior process is insufficient, and possessed of a serious flaw. Since the light that is imaging all of the planes (in turn) is coherent, coherent interference between the data planes will cause a large amount of noise in the reconstruction. To solve this problem the present invention employs several angularly-multiplexed reference beams instead of just one.

Moreover, these reference beams should be, and, in accordance with the present invention, preferably are, mutually incoherent so as to avoid coherent artifact noise.

The holographic data stamping element ultimately generated contains multiple images of planes of data, each image plane having been generated by (i) multiple (ii) incoherent (iii) angularly-separated reference beams. (Note that one reference beam does not generate one image plane; multiple reference beams generate each image plane.)

1.2 Using the Holographic Data Stamping Element

In accordance with the present invention the generated holographic data stamping element is used to record the same data with which it has been impressed into a volume optical medium, forming thereby a volume optical memory.

The recording is done redundantly, with a number of different reference beams. It is done all at the same time in a "data stamping" operation. The optical data content of each layer to be recorded in the medium of the optical memory will necessarily be imaged in focus at only one plane (in depth) within the memory. However, the optical power intended for each layer will by necessity propagate through all layers in the media. The light from all other layers propagating through any given layer will be manifest as noise at that layer.

Now, by reference to the preceding section 1.1, it will be understood that a higher degree of incoherency in the readout of the holographic data stamping element is achieved by reconstructing the hologram with all of a number of illuminating reference beams simultaneously, each reference beam being (i) at a different reference angle, and being derived from (ii) a separate coherent light source which is incoherent with respect to the light source of every other reference beam. As the number of mutually incoherent reference beams is increased the magnitude of the coherent noise will go down until the only evidence of neighboring data layers at any given layer will be a background optical noise of nearly uniform intensity.

However, this uniform intensity background noise—which is an achievement of the present invention—is also a drawback. This is because this noise—which is consequence not only of the data stamping method of the present invention but any method optically writing more than one layer at one time—significantly reduces the contrast ratio observed at any given layer.

Certain optical media that exhibit highly non-linear recording characteristics are, however, able to remove this background from the signal during the recording process. In particular, the dye- doped photopolymer media that is the subject of the related patent application, and that is preferred for use in the method of the present invention, exhibits a sharp step-like threshold in its recording intensity curve. See that related application, incorporated herein by reference. See also M. M. Wang and S. C. Esener, "Three-dimensional optical memory in fluorescent dye-doped photopolymer," submitted to Applied Optics (Dec. 2, 1998), op cit.

Intensities below the threshold of the dye-doped photopolymer do not stimulate recording. However, intensities just beyond this threshold exhibit a high recording rate. By setting the signal intensity of the data layer above the recording threshold of the media and the background intensity below the threshold, the desired data may be recorded with a high contrast ratio.

2. Generating a Master Hologram Suitable for Data Stamping

Accordingly, in one of its aspects the present invention is embodied in a method of generating in a first optical medium a master hologram containing information suitably imaged simultaneously into multiple bit-oriented layers within a volume of a second optical medium. The master hologram is thus suitable for holographic stamping of multi-layer bit-oriented optical medium.

The preferred method consists of redundantly generating the master hologram in the first optical medium by use of a plurality m of separate reference beams, each beam bearing information suitably recorded in one or more of a plurality n layers of the second optical medium that are distinct from layers in which information in all other beams is suitably recorded.

The redundantly generating is preferably by use of a plurality m of different reference beams. The m different reference beams may differ in angular separation and/or by being incoherent.

The present invention is also embodied in an optical hologram produced by this method.

3. Holographically Stamping a Multi-layer Bit-oriented Optical Medium

In another of its aspects the present invention is embodied in a method of holographically stamping a multi-layer bit-oriented optical medium.

The method consists of recording information within a plurality n layers of the volume of the blank optical medium with m separate recording beams. The recording beams are produced by simultaneously illuminating a master hologram with m reference beams simultaneously. The recorded optical medium exhibits highly non-linear recording characteristics sufficient so that a recording beam holographically focused to a target layer possesses intensity sufficient to write the layer while the cumulative intensities at all layers arising from the collective beams not focused to the target layer remain insufficient to write the target layer.

By this procedure, performed on this optical medium, the entire optical medium may be optically written, or stamped, in its multi-layer three dimensional volume entirely at one time.

The recording is preferably by use of a plurality m of separate reference beams that are different by being (i) mutually incoherent and/or (ii) angularly separated, and preferably both.

The first optical medium exhibiting highly non-linear recording characteristics is preferably unresponsive to beam intensities below a threshold, these beam intensities being insufficient to write the medium, while beam intensities just beyond this threshold are sufficient to write the medium. This makes that when a recording beam holographically focused to a layer will possess intensity sufficient to write the layer while the cumulative intensities at all layers arising from the collective beams not holographically focused to that layer will remain insufficient to write the layer.

The recording is more preferably within a dye-doped photopolymer medium exhibiting the highly non-linear recording characteristics.

4. Holographic Data Stamping

The (i) generating of a master hologram suitable for data stamping and (ii) the holographically stamping of a multi-layer bit-oriented optical medium may usefully be combined as an integrated system, and method.

The method may be considered an improvement upon more rudimentary prior methods where a master hologram within a first optical medium containing information to be placed within the volume of a second optical medium is first generated, and then this generated master hologram is used to record the information within multiple layers of the three dimensional volume of a (blank) second optical medium.

In accordance with the present invention, the generating is improved by redundantly generating the master hologram in the first optical medium. The redundant generation transpires by use of a plurality of m separate reference beams, each beam bearing information suitably recorded in one or more of a plurality n layers of the second optical medium.

The using is also improved: generation of the master hologram recording the information within the n layers of the volume of the blank optical medium by is improved by use of m recording beams that are produced by simultaneously illuminating the master hologram with m separate reference beams.

The redundantly generating is more preferably by use of the plurality m separate reference beams that are different by being (i) angularly separated and/or (ii) mutually incoherent. The reference beams are more preferably both (i) angularly separated and/or (ii) mutually incoherent.

Likewise, the using of the generated hologram is more preferably by simultaneously illuminating the master hologram with the m different reference beams that are themselves different by being (i) angularly separated and/or (ii) mutually incoherent, and preferably both (i) angularly separated and (ii) mutually incoherent.

The using is preferably so as to record information within a second optical media exhibiting highly non-linear recording characteristics. Namely, recording beam intensities below a threshold are insufficient to stimulate recording while recording beam intensities just beyond this threshold exhibit a high recording rate. The intensity of the recording beams are set above a recording threshold of the second optical medium where the recording beams are focused on layers while background intensity within the second optical medium remains below this threshold, making that the second optical medium is recorded with a high contrast ratio.

The using of the master hologram is still more preferably to record information within a dye-doped photopolymer medium that exhibits the highly non-linear recording characteristics.

A least two combinations of reference beams are suitable. The m separate reference beams as do redundantly generate the master hologram may be used to record each of the n layers of the volume of the blank second optical medium. Alternatively, each of the n layers of the second optical medium is recorded with the m separate reference beams, resulting in a total of m x n separate reference beams.

5. Optical Holograms for Data Stamping, and Data-Stamped Optical Memories

In still yet another of its aspects the present invention is embodied in a an optical hologram suitable to holographically stamp a multi-layer bit-oriented first optical medium. The optical hologram is characterized in that (i) information within the optical hologram is organized for bit-oriented recording of another multiple layers within the three-dimensional volume of another, second, optical medium, while (ii) the optical hologram has itself been generated by use of a plurality m of separate reference beams, each beam bearing information suitably recorded in one or more of a plurality n layers of the second optical medium that are distinct from layers in which information in all other beams is suitably recorded.

The optical hologram is preferably so generated by use of m separate reference beams that differ in (i) angular separation and/or (ii) by being mutually incoherent. The reference beams preferably differ in both (i) angular separation and (ii) by being mutually incoherent.

The optical hologram may be generated (i) so as to be suitably redundantly illuminated by the same m separate reference beams in order to record each of the n layers of the volume of the blank second optical medium, or, alternatively, (ii) so as to be suitably redundantly illuminated by a different m reference beams in order to record each of the n layers of the volume of the blank second optical medium.

In a similar manner, the present invention is also embodied in a multi-layer bit-oriented information-containing volume optical memory characterized for having been made by a process of data stamping, meaning that all the information that is within the memory was placed into all the multiple layers thereof all at the same time. As a consequence of this data stamping, the volume optical memory is optically readable in layers, each layer by a plurality of reference beams that are typically so many in number as there are layers.

In particular, the multi-layer bit-oriented information-containing volume optical memory is preferably made by use of a plurality m of separate reference beams, each beam bearing information that was recorded in one or more of a plurality n layers of an optical medium of the memory. The m separate reference beams may differ in angular separation and/or by being mutually incoherent.

The memory may be suitably redundantly illuminated by a same m separate reference beams in order to read each of n layers within the volume of the memory or, alternatively, by a different m reference beams in order to record each of the n layers within the volume of the memory.

These and other aspects and attributes of the present invention will become increasingly clear upon reference to the following drawings and accompanying specification.

BRIEF DESCRIPTION OF THE DRAWINGS

Referring particularly to the drawings for the purpose of illustration only and not to limit the scope of the invention in any way, these illustrations follow:

FIG. 7(a) illustrating the fabrication of the holographic element, and FIG. 7(b) illustrating use of the element to stamp data layers into a 3D optical storage media.

FIG. 8, consisting of FIGS. 8a through 8d, are images from the two-layer stamping experiment: FIGS. 8(a) and 8(b) showing the two data layers from the holographic element imaged in air, while

FIG. 9 is a Table 1 showing the SNR for the cases of single beam readout, three coherent beam readout, and three incoherent beam readout of holograms used in the method of the present invention.

DESCRIPTION OF THE PREFERRED EMBODIMENT

Figure 1:
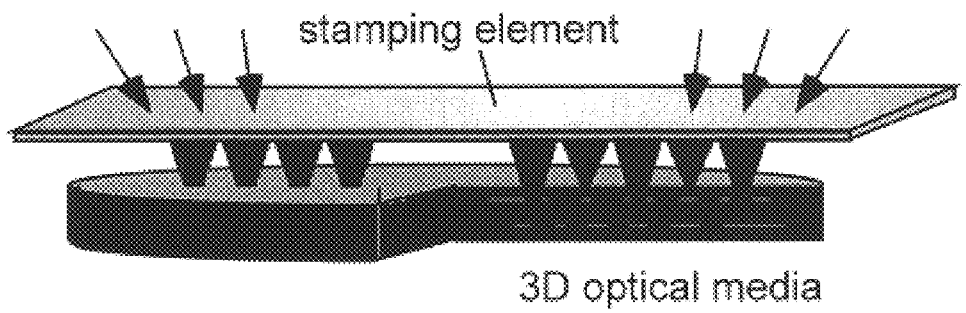
FIG. 1 is a diagrammatic representation of multi-layer optical data stamping with a holographic stamping element.
Figure 1:
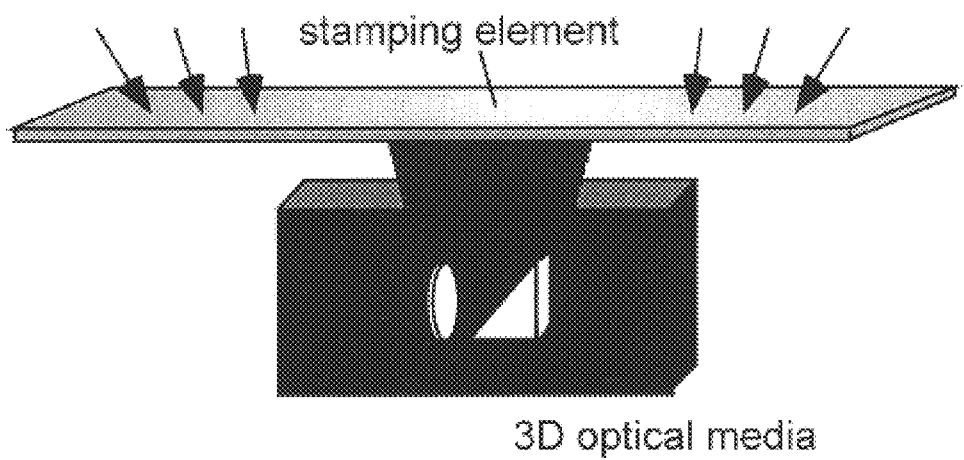

Although specific embodiments of the invention will now be described with reference to the drawings, it should be understood that such embodiments are by way of example only and are merely illustrative of but a small number of the many possible specific embodiments to which the principles of the invention may be applied. Various changes and modifications obvious to one skilled in the art to which the invention pertains are deemed to be within the spirit, scope and contemplation of the invention as further defined in the appended claims.

1. Introduction

As explained in the BACKGROUND OF THE INVENTION section of this specification, the feasibility of three-dimensional data stamping, meaning the parallel recording of data into the bit-oriented domains, or voxels, of a three-dimensional optical medium, could be useful for the speedy, and cost effective, loading of three-dimensional optical memories with data, particularly at a time before the memory is first sold.

The present invention implements three-dimensional data stamping through the use of a large-area holographic imaging element. The three-dimensional object that one wishes to construct is first pixelated into multiple layers of data (multi-layer data). A volume hologram is then designed that allows the imaging of these many layers of data simultaneously into a volume space. If the optical medium used to store the information is able to exhibit a high enough non-linear response to light intensity then it becomes possible to record multiple layers of data simultaneously with a single optical exposure. Limitations to this technique arise from the bandwidth requirements on the holographic element, the degree of non-linearity required of the media, and the tolerance requirements for the optical exposure levels.

We, the inventors, have recently reported on a new type of 3D optical data storage media which may be suitable for multi-layer data stamping. See M. M. Wang and S. C. Esener, op cit. This material is the subject of the related patent application, the contents of which are incorporated by reference.

This material which is based on a fluorescent dye-doped photopolymer exhibiting a sharp threshold in its intensity response; thereby permitting the three-dimensional confinement of recorded bits. Materials based on a similar mechanism may also be developed for micro-component fabrication applications. The present invention, and the associated theoretical studies, presented in this specification deal specifically at the optical pattern generation process, and are applicable to either the recording or fabrication application.

Accordingly, the present invention concerns a holographic element intended for multi-layer data stamping. The theoretical limitations of this mode of recording are determined in regard to the optical data generation process. The expected performance of such a holographic volume stamping element is examined through a model of the coherent noise effects that result from the interference of the many data layers with each other. It is shown that higher signal-to-noise values may be achieved through the use of semi-coherent light during the readout of the hologram.

The main limitations to the method of the present invention arise from the bandwidth requirements on the holographic volume stamping element, the degree of non-linearity required of the bit-oriented media, and the tolerance requirements for the optical exposure levels. As a demonstration of the concept and method of the present invention, a two-layer stamping element has been fabricated and used to simultaneously stamp two layers of data into a 3D dye-doped photopolymer storage media.

Accordingly, in Section 2 we first describe the concept behind the holographic data stamping element of the present invention. In Section 3 we investigate the expected performance for holographic stamping elements fabricated for two different architectures, determining some of the tradeoffs between signal-to-noise and capacity. In Section 4 we describe our experiment in the fabrication of a two-layer stamping element and the use of this element in the data stamping of a preferred dye-doped photopolymer optical storage media. It will be shown that although high quality multi-layer imaging is possible, the stringent requirements it poses on the performance of both the holographic element and the recording media limit the range of applications for which this technique is presently suitable.

2. Concept and Method of the Present Invention

To achieve optical stamping, the data information within an entire volume must be simultaneously optically generated. Holographic elements are ideal for this purpose since they permit both an arbitrarily large imaging area with high resolution, plus the ability to have variable focal depths for many layers of data See FIG. 1. Reference D. W. Rush, J. Vance, J. Goldhar, and G. L. Burdge, "High resolution reflection holography using DuPont photopolymer holographic film," Proc. SPIE 2688, 141–154 (1996).

Volume holograms have already been demonstrated for the optical stamping of holographic stores, or memories, that are, most commonly, not bit-wise organized where a data bit is stored in each of a large number of defined voxels. However, in the present invention we wish to use a volume hologram particularly so as to data stamp into a bit-oriented multi-layer media.

In both cases, the technique for generating the holographic master is similar. The information is first serially (or in low degrees of parallelism) encoded into a holographic master by stepping the position of an imaging head and rapidly modulating the light with the appropriate data. When the holographic master is complete, a blank media may be recorded with this information by simultaneously illuminating the master hologram with all of the reference beams and allowing the data to be transferred from this master hologram into the blank optical medium.

It should immediately be noted that information theory implies that we will not be able to generate simultaneously any more optical information in a three-dimensional volume than could be achieved in any 2D plane intersecting that volume. See D. Gabor, "Light and Information," Progress in Optics, Vol. 1, ed. E. Wolf (North-Holland, Amsterdam, 1961), 109–153; and D. A. B. Miller, "Spatial channels for communicating with waves between volumes," Opt. Lett. 23, 1645–1647 (1998).

Although we are not able to avoid this limitation, we can achieve a higher data capacity by making a tradeoff with signal strength and noise as is described below.

In designing a holographic stamping element for a bit-oriented media one would ideally wish to use only one reference beam to the hologram for greatest simplicity. However, if a single coherent beam is used to compose the data in multiple layers, coherent interference will result between the data of the many layers. If instead—in order to minimize inter-layer crosstalk—each data bit in a particular layer is given a random phase, then the out-of-focus image of that data layer seen at the position of any other data layer will resemble random speckle noise with an unacceptably high intensity.

One solution for reducing this coherent noise problem is to use a higher degree of incoherency in the illumination of the hologram. Completely incoherent light sources are not suitable for hologram reconstructions.

Instead, in accordance with the present invention we redundantly record the same data into a volume hologram with a number of different reference beams. A higher degree of incoherency in the readout may then be achieved by reconstructing the hologram with all of the reference beams simultaneously, each at a different reference angle using a separate coherent light source which is incoherent with respect to every other illuminating beam. As the number of mutually incoherent reference beams is increased the magnitude of the coherent noise will go down until the only evidence of neighboring data layers at any given layer will be a background of nearly uniform intensity.

However, this uniform intensity background which an achievement of the present invention is also a drawback. This is because this method of data stamping significantly reduces the contrast ratio observed at any given layer.

Certain optical media that exhibit highly non-linear recording characteristics are, however, able to remove this background from the signal during the recording process. In particular, the dye-doped photopolymer media that is the subject of the related application, and that is preferred for use in the method of the present invention, exhibits a sharp step-like threshold in its recording intensity curve. See M. M. Wang and S. C. Esener, "Three-dimensional optical memory in fluorescent dye-doped photopolymer," submitted to Applied Optics (Dec. 2, 1998), op cit.

Intensities below the threshold of the dye-doped photopolymer do not stimulate recording. However, intensities just beyond this threshold exhibit a high recording rate. By setting the signal intensity of the data layer above the recording threshold of the media and the background intensity below the threshold, the desired data may be recorded with a high contrast ratio.

3. Modeling

The optical data content of each layer to be recorded in a media will necessarily be imaged in focus at only one plane in depth. However, the optical power intended for each layer will by necessity propagate through all layers in the media. The light from all other layers propagating through any given layer will be manifest as coherent noise at that layer. To ameliorate inter-layer crosstalk of the data, the binary intensity data bits of each layer are also given a random phase. Provided that some modulation code has been employed such that no large areas of all "on" or all "off" bits exist grouped within any given layer, and that a sufficient distance exists between layers such that the light waves from many bits will interfere with each other, the intensity pattern from any given layer at the position of any other layer will resemble random speckle noise. Experimental data suggests the magnitude of that noise and the degree to which it may be reduced by adding increasing levels of incoherency to the readout.

The technique that we have examined for adding incoherence to the readout beam is to successively add mutually incoherent reference beams to the hologram which redundantly image the same data. Suppose that the number of reference beams is m and the number of layers to be stamped is n. We wish to consider two different designs.

In a first design in accordance with the present invention every layer is recorded with the same m reference beams.

In a second design in accordance with the present invention we instead record every layer with a m different reference beams, resulting in a total of m x n independent reference beams. There are more reference beam angles required in the second design; however the total number of recordings necessary to fabricate the hologram in each design will be the same.

Consider first the expected intensity distribution for a light wave interfered with circularly Gaussian coherent noise. See J. W. Goodman, *Statistical Optics* (John Wiley & Sons, New York, 1985); and C. Gu, G. Sornat, and J. Hong, "Bit-error rate and statistics of complex amplitude noise in holographic data storage," Opt. Lett. 21, 1070–1072 (1996).

The amplitude of the signal for a "on" bit will be given as s. The complex noise amplitude has a standard deviation of a which is determined by the number of layers being imaged. The probability density function (PDF) of intensities for such a light source is Rician and may be given as $$P_{signal}(I) = \begin{cases} \left(\frac{1}{2\sigma^2}\right) \exp\left(-\frac{I+s^2}{2\sigma^2}\right) I_0\left(\frac{s\sqrt{I}}{\sigma^2}\right) & \text{for } I \geq 0 \\ 0 & \text{for } I < 0 \end{cases} \quad (1)$$

where $I_0(x)$ is the zeroth-order modified Bessel function. For the case where s=0 (i.e. the intensity distribution of "off" bits), Equation (1) reduces to $$P_{background}(I) = \begin{cases} \left(\frac{1}{2\sigma^2}\right) \exp\left(-\frac{I}{2\sigma^2}\right) & \text{for } I \geq 0 \\ 0 & \text{for } I < 0 \end{cases} \quad (2)$$

which is the instantaneous probability density of polarized thermal light.

Two beams that are truly incoherent may be considered as independent random variables. The sum of two independent random variables may be found from the convolution of their respective PDF's. Since in this case we wish to find the sum of many variables, we find it easier to first derive the characteristic function of our probability density and then calculate the product of the characteristic functions. The characteristic function is found by taking the Fourier transform of the probability density function and for Equation (1) may given by $$M_{signal}(\omega) = F\{p_{signal}(I)\} \quad (3)$$

$$= \frac{j \exp\left(-\frac{s^2\omega}{j + 2\sigma^2\omega}\right)}{j + 2\sigma^2\omega}.$$

Similarly, the characteristic function of Eq. (2) is given by $$M_{background}(\omega) = \frac{1}{1 - 2j\omega\sigma^2}. \quad (4)$$

The PDF for the sum of m mutually incoherent references beams may be found from the product of m characteristic functions for either the "on" or "off" bits. For example, for the "on" bits we have:

$$P_{on}(I) = F^{-1}\{M_{signal}(\omega)^m\}, \quad (5)$$

and for "off" bits we have:

$$P_{off}(I) = F^{-1}\{M_{background}(\omega)^m\}. \quad (6)$$

Figure 2:
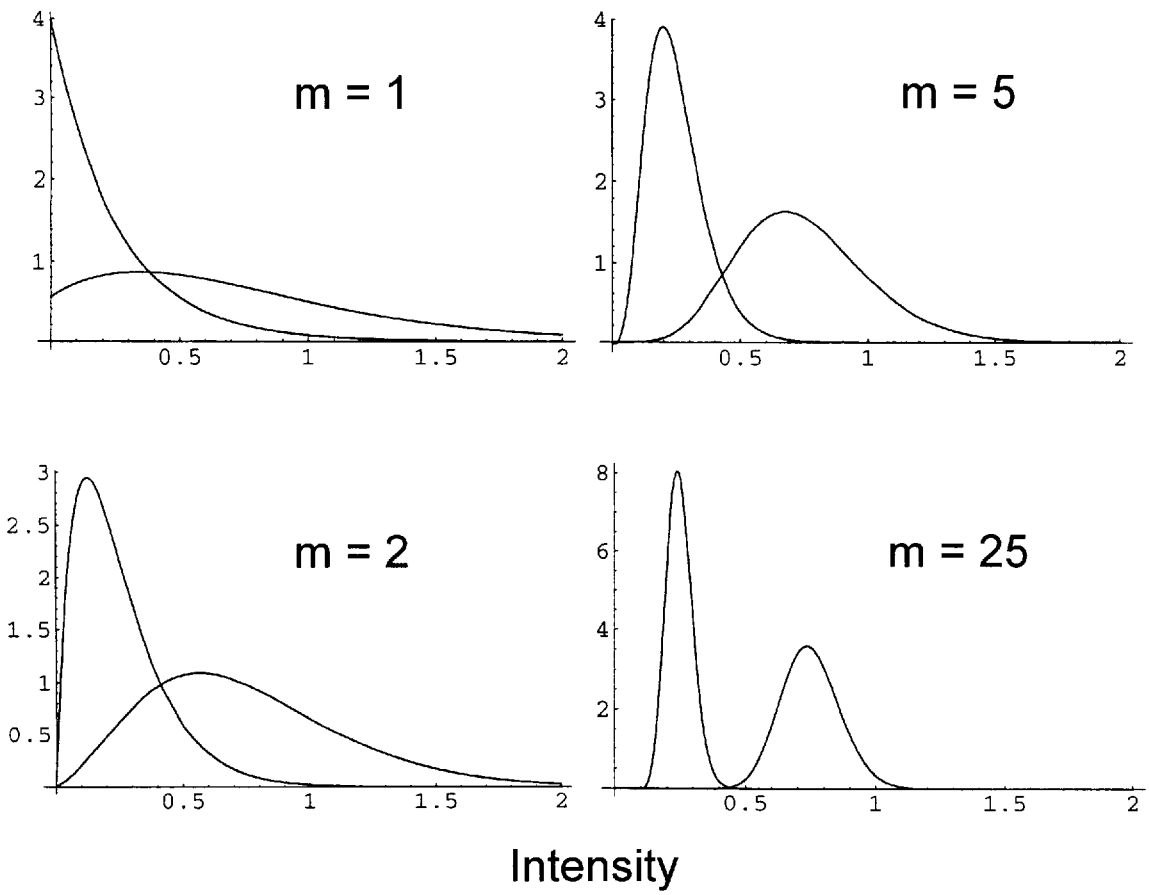
FIG. 2, consisting of FIGS. 2a through 2d, are graphs showing the probability distribution functions of the "on" and "off" bit intensities for, respectively, m=1, 2, 5, and 25 when n=2 where reference beam angles are reused for each layer.
Figure 3:
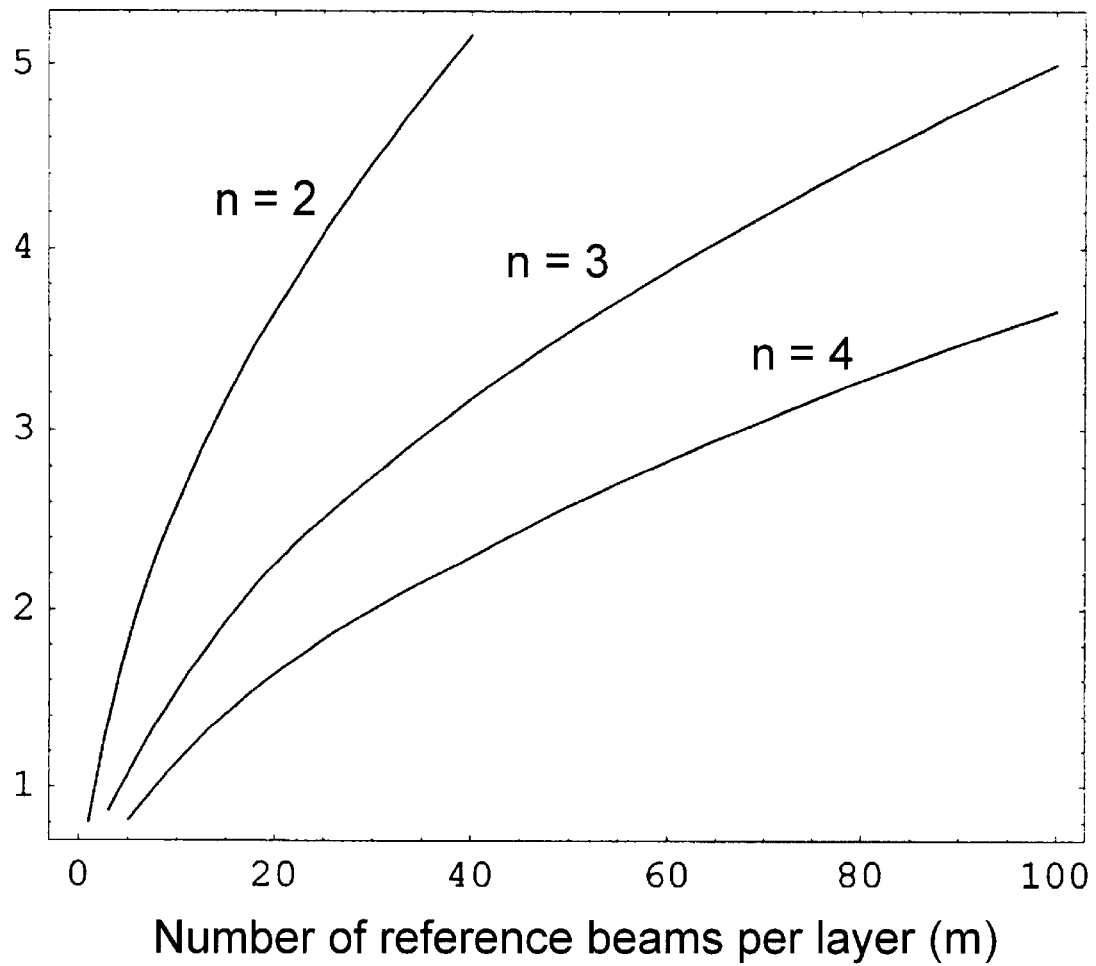
FIG. 3 is a graph showing SNR as a function of the number of reference beams (m) for several different numbers of layers (n) in the case where reference beam angles are reused for each layer.

We have computed these probability density functions numerically. FIG. 2 shows PDF's plotted for four different m values when n=2. It can be seen that for the case where m=1 (i.e. a single coherent readout beam) the overlap between the intensity distributions of the "on" and "off" bits is severe. By increasing the number of readout beams, the "on" and "off" distributions gradually become more distinct. For quantitative comparison, the signal-to-noise ratio (SNR) of these PDF's may be determined as $$SNR = \frac{\bar{I}_1 - \bar{I}_0}{(\sigma_1^2 + \sigma_0^2)^{1/2}} \quad (7)$$

where $\bar{I}_1$ and $\bar{I}_0$ are the mean values and $\sigma_1^2$ and $\sigma_0^2$ are the variances of the intensities of "on" and "off" bits, respectively. FIG. 3 plots the SNR as a function of the number of reference beams (m) for several different values of n. As the number of layers to be stamped increases, it requires an increasingly large number of reference beams per layer to maintain an equivalent SNR.

We now investigate our second design in which reference beams are not reused in the recording of subsequent layers. The signal contributions and noise contributions from every plane will add incoherently resulting in a PDF which can be written as:

$$P_{on}(I) = F^{-1}\{M_{background}(\omega)^{m(n-1)} \exp(j\omega s^2)^m\}. \quad (8)$$

Similarly, for the "off" bits we have:

$$P_{off}(I) = F^{-1}\{M_{background}(\omega)^{m(n-1)}\}. \quad (9)$$

Figure 4:
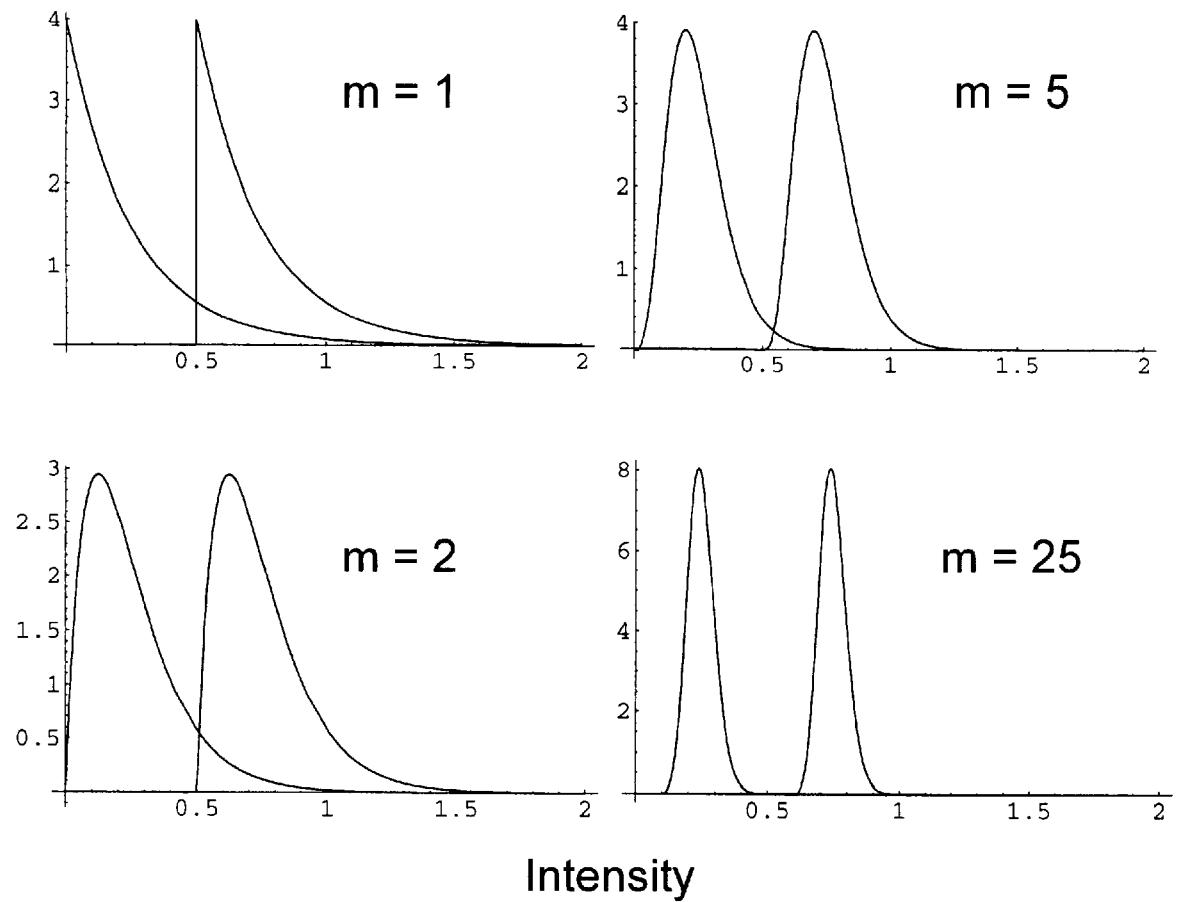
FIG. 4, consisting of FIGS. 4a through 4d, are graphs showing the probability distribution functions of the "on" and "off" bit intensities for, prospectively, m=1, 2, 5, and 25 when n=2 where reference beam angles are not reused.
Figure 5:
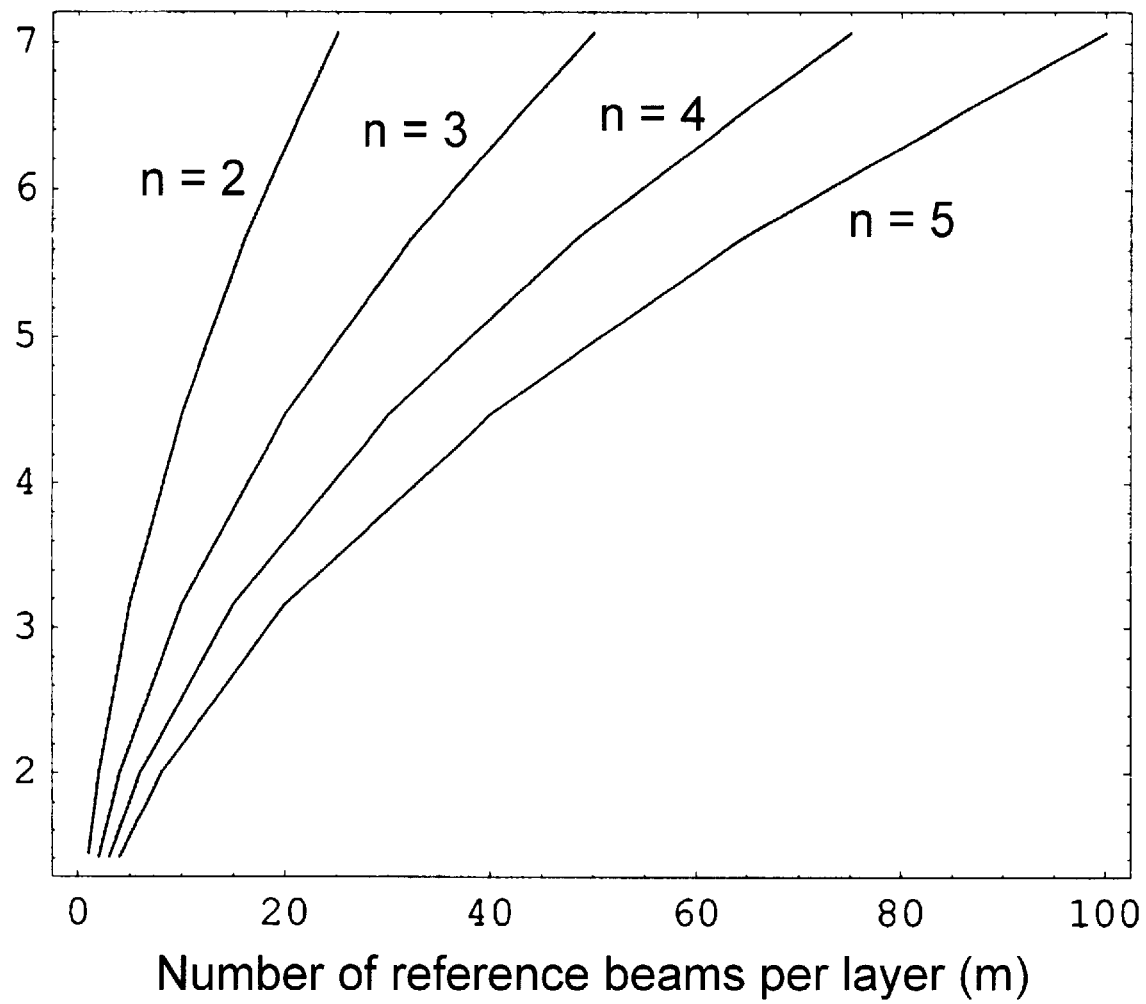
FIG. 5 is a graph showing SNR as a function of the number of reference beams (m) for several different numbers of layers (n) in the case where reference beam angles are not reused.

Again these PDF's are computed numerically and examples are shown in FIG. 4. For any given value of m it can be seen that the intensity distributions for "on" and "off" bits are better separated in this second design than in the first. Plotting the SNR as a function of m (see FIG. 5) we see that for a given n and m the SNR is higher for this second design. The number of reference beams required to maintain an equivalent SNR still increases with increasing n, however in this case we can see that the increase in m is linear with n for a given desired performance constraint. This means that the total number of recordings necessary to fabricate the hologram will increase proportional to n(n−1).

Figure 6:
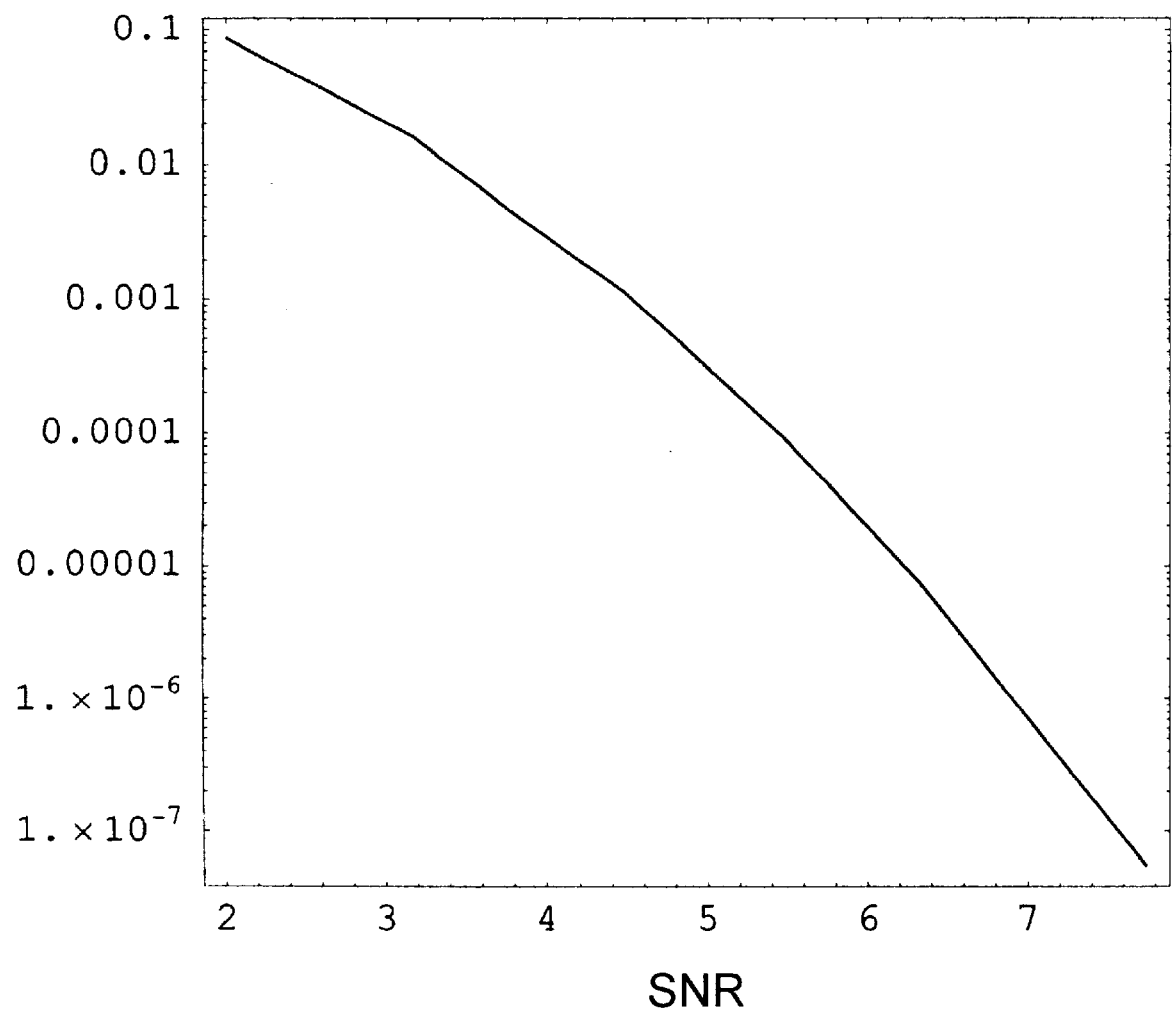
FIG. 6 is a graph showing bit error rate as a function of SNR calculated for the design in which reference beam angles are not reused.

Determining a minimum sufficient SNR will depend on how the PDF's will be transformed after the data is recorded into an optical media, however to get an idea of what these SNR values mean just for the stamping element by itself we have calculated the corresponding bit-error rates for the curves in the second design (see FIG. 6). Note that the SNR values are not exactly comparable between the first design and the second design because the resulting density functions have differing shapes.

4. Experiment

Figure 7:
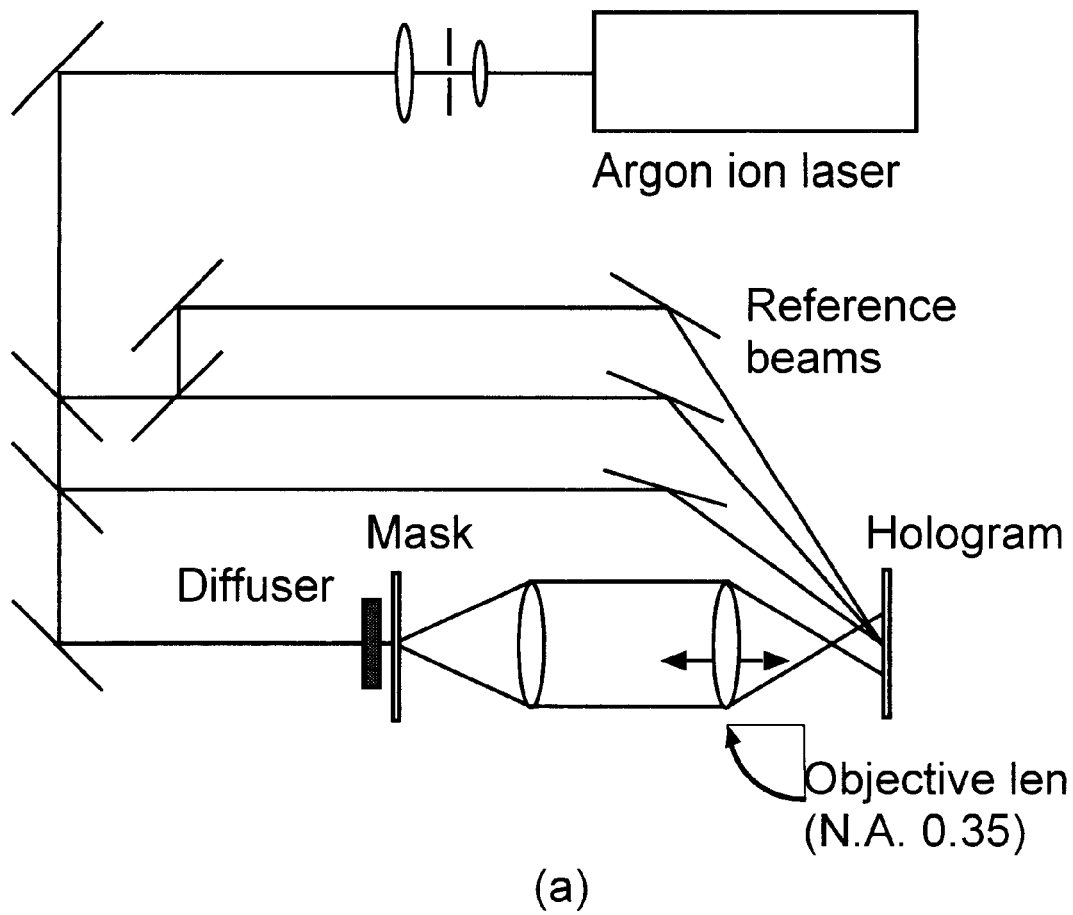
FIG. 7 consisting of FIGS. 7a and 7b, are diagrams illustrating the experimental setups of the present invention.

We wish to verify our claim that SNR may be enhanced through the use of semi-coherent light. For this purpose we have performed a simple demonstration experiment in which a two-layer holographic stamping element has been fabricated and used to simultaneously stamp two data layers into a 3D optical storage media. The Dupont HRF-150 photopolymer was used as the optically-recordable volume holographic material. The hologram recording and readout setups are shown in FIG. 7. See K. Curtis and D. Psaltis, "Characterization of the DuPont photopolymer for three-dimensional holographic storage," Appl. Opt. 33, 5396–5399 (1994).

Three references beams and one signal beam are separated from the 488 nm line of an argon-ion laser. Images were recorded sequentially by blocking all but one of the references beams during each recording. Due to the difficulties in generating a large number of simultaneous reference beams, in this experiment we used only three reference beams and we reused these same beams for the recording of each layer, as described in our first design in the previous section. Ideally, the chrome data masks used for recording the hologram would be coupled with a pixel-to-pixel matched random phase mask to randomize the phases of the recorded bits, however for ease of implementation we used instead of a pixel matched phase mask a ground glass plate immediately before the amplitude mask. Although the ground glass plate is able to randomize phases, it has the disadvantage of causing speckle, resulting in a hologram that has coherent noise in addition to the coherent noise caused by neighboring imaged layers.

To generate this two layer stamping element with three reference beams required a total of six exposures. Following a pre-exposure to bring the photopolymer into its linear recording range, the subsequent exposure times were chosen to give uniform readout diffraction efficiencies while making use of the full dynamic range of the recording material. The random bit pattern data image intended for the first layer is first recorded with each of the three reference beams. The data image is then changed and the position of the objective is shifted axially by 150 $\mu$m to focus to a new depth before recording the last three exposures. The layer spacing chosen here was constrained by the low numerical aperture of the focusing objective (N.A. 0.35) which was itself constrained by the need for a long working distance between the lens and the hologram. The square bits have lateral dimensions of 25 $\mu$m.

For readout of the hologram the signal beam is blocked and all three reference beams are opened. The holographic film is turned around 180° to allow phase conjugate readout. Because the image plane of the optical system was put in front of the hologram during recording, using phase conjugate readout results in a real image being generated at the output of the hologram. Phase conjugate readout was advantageous here because it allowed a greater distance between the recording material and the focusing objective during hologram recording, and therefore shallower reference beam angles. To achieve a relative incoherence between the three different reference beams two of the cube beamsplitters used in the recording of the hologram were replaced with pellicle beamsplitters. The pellicle beamsplitters were then vibrated either through random acoustical noise or simply by tapping on the optical table. Since the optical paths for the three reference beams were not exactly the same the vibration of the pellicles was enough to destroy the relative coherence between the beams while allowing each individual beam to retain sufficient spatial and temporal coherence.

Figure 8A:
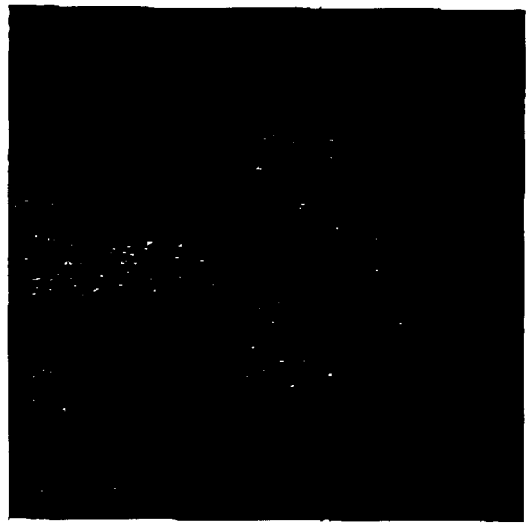
Figure 8B:

FIG. 8(a) shows the hologram output at two planes in air captured by a CCD camera. When all reference beams are turned on the total diffraction efficiency is on the order of $3 \times 10^{-3}$. Although there is still evident a high degree of coherent noise, the SNR of these images has been improved by the addition of multiple incoherent sources. The SNR as defined by Equation 7 was measured for this two-layer hologram as well as a single-layer hologram that was also fabricated. Intensities values were measured at every CCD pixel within a representative "on" and "off" square bit and used to calculate the SNR. The SNR for the cases of single beam readout, three coherent beam readout, and three incoherent beam readout of these holograms is shown in Table 1 of FIG. 9. As can be seen, although the SNR is low due to the high degree of speckle noise, the SNR is increased in both cases when the holograms are readout by multiple incoherent beams. As was determined in our model, three beams are insufficient to produce a high quality image and the addition of more reference beams would be desirable.

To demonstrate multi-layer optical stamping the two-layer hologram was used to record images into the preferred 3D fluorescent dye-doped photopolymer media. This particular media is designed for bit-oriented recording with laser-induced fluorescent readout and exhibits a highly non-linear recording sensitivity.

Figure 8C:
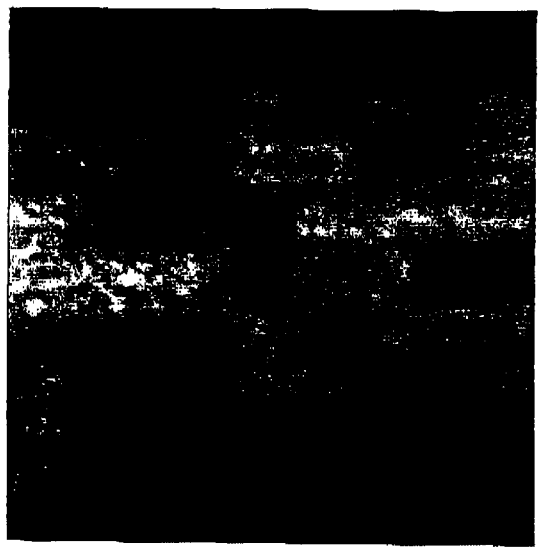
FIGS. 8(c) and 8(d) show the fluorescence collected from the two data layers after being stamped in a dye-doped photopolymer, where the recorded layers in the material are separated by approximately 225 $\mu$m.
Figure 8D:
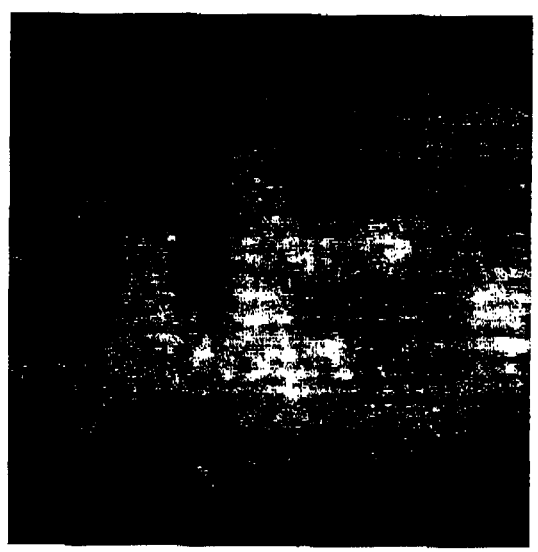

When imaged into the media the plane separation becomes approximately 225 $\mu$m assuming an index of refraction of 1.5 for the material. The stamping element was illuminated with a total of 350 mW/cm$^2$ from the argon-ion laser and allowed to expose the media for 30 seconds. Readout of the fluorescence of the recorded media was performed with an orthogonally addressed frequency-doubled continuous wave Nd-YAG laser (532 nm). Fluorescence from each plane was imaged and captured on a CCD camera as shown in FIGS. 8(c) and 8(d).

5. Discussion and Conclusions

The fluorescent dye-doped photopolymer was chosen here as the stamping media for its intensity threshold response. Ideally, given a high SNR image that has low contrast, a material that exhibits an intensity threshold in recording should be able to improve the contrast of the recorded image. The image quality produce here is only modest due to the very low starting SNR of the images produced by the stamping element.

A number of things are expedient to be done in order to improve the hologram SNR. In particular, the number of reference beams may be increased. A practical method for producing many simultaneous, mutually-incoherent reference beams is to implement a large array of vertical cavity surface emitting lasers (VCSEL's).

Further problems are expected to arise, however, from a large increase in the number of reference beams and required hologram recordings. Notably, the diffraction efficiency from the volume hologram will decrease (as previously explained) as the number of exposures is increased. To avoid having to make a tradeoff between SNR and diffraction efficiency, techniques such as hologram copying are anticipated to be used to improve the stamping element performance. Additionally, for any particular holographic medium, it must be empirically demonstrated that the required high resolution data recording can be achieved.

The total number of layers that may be stamped at one time is determined by (i) the achievable SNR of the stamping element and also (ii) the degree of non-linearity of the media to be stamped. As the number of layers increases the contrast ratio of the optically generated images decreases. We have assumed in our model that the fill-factor in every data layer will be approximately 50%. This assumption is correct for data storage applications and represents a worst case scenario. For other applications, such as micro-component fabrication, the fill factor may be significantly less, which may permit a corresponding increase in the number of layers that may be recorded with high contrast ratio.

The number of recordable layers is also limited by the material non-linearity. A sharper intensity threshold from the material allows a better cutoff response between the signal and the background. The dye-doped photopolymer used in the experiment exhibits a fairly sharp threshold response that are expected to be further improved through further optimizations of its chemical composition.

Constraints imposed by the high bandwidth requirements on the hologram as well as the precise tolerances required in the media response and in the optical exposure intensity limit the scalability of the holographic stamping method described here. As the number of desired layers increases, the practical limitations become more severe. Because of the impressive advancements that have been made in planar optical data storage technology it may be difficult to support bit-oriented volumetric stamping in this manner as a competitive technology. However, for applications such a rapid fabrication of micro-components and micro-optical systems the bandwidth and tolerance requirements are less severe and may be more practical. Further work demonstrating practical prototyping in these directions is anticipated.

In accordance with the preceding explanation, variations and adaptations of the method of three-dimensional holographic stamping of multi-layer bit-oriented non-linear optical media in accordance with the present invention will suggest themselves to a practitioner of the optical recording arts. For example, the reference beams could be distinguished in polarization.

In accordance with these and other possible variations and adaptations of the present invention, the scope of the invention should be determined in accordance with the following claims, only, and not solely in accordance with that embodiment within which the invention has been taught.

What is claimed is:

1. In a method including
    generating in a first optical medium a master hologram containing information to be placed within the volume of a second optical medium, and then
    using the generated master hologram to record the information within multiple layers of the three dimensional volume of a blank second optical medium,
    an improvement wherein the generating comprises:
        redundantly generating the master hologram in the first optical medium by use of a plurality m of separate reference beams, each beam bearing information suitably recorded in one or more of a plurality n layers of the second optical medium; and wherein the using comprises:
        simultaneously illuminating the master hologram with all of the m separate reference beams to produce m separate recording beams; and
        recording information simultaneously within all n layers of the volume of the blank optical medium by simultaneous use of all m recording beams.

2. The improvement to the generating and the using of a optical hologram according to claim 1
    wherein the redundantly generating of the master hologram is by use of the plurality m separate reference beams that are different by being angularly separated one to the next; and
    wherein simultaneous illuminating the generated master hologram is with the m different reference beams that are angularly separated one to the next.

3. The improvement to the generating and the using of a optical hologram according to claim 2
    wherein the redundantly generating is by use of a plurality m of different angularly-separated reference beams that are mutually incoherent; and
    wherein simultaneously illuminating the generated hologram is with m different angularly-separated reference beams that are mutually incoherent;
    wherein, by this redundantly generating and by this simultaneously illuminating, a high degree of incoherency is thus obtained in any subsequent readout of recorded information from layers of the recorded optical medium, meaning that evidence of neighboring data layers during any optical readout of any one layer of the recorded optical medium will become as background noise having nearly uniform intensity.

4. The improvement to the generating and the using of a optical hologram according to claim 1
    wherein the redundantly generating is by use of a plurality m of separate reference beams that are different by being mutually incoherent; and
    wherein simultaneously illuminating the generated hologram is with the m different reference beams that are mutually incoherent.

5. The improvement to the generating and the using of a optical hologram according to claim 4
    wherein the redundantly generating is by use of a plurality m different mutually-incoherent reference beams that are angularly separated one to the next; and
    wherein simultaneously illuminating the generated hologram is with the m different mutually-incoherent angularly-separated reference beams;
    wherein, by this redundantly generating and by this simultaneously illuminating, a high degree of incoherency is thus obtained in any subsequent readout of layers of the recorded information from the recorded optical medium, meaning that evidence of any and all neighboring data layers during any optical readout of recorded information from of any one layer of the recorded optical medium will become as background noise having nearly uniform intensity.

6. The improvement to the generating and the using of a optical hologram according to claim 1
    wherein the recording information is within a second optical media exhibiting highly non-linear recording characteristics where recording beam intensities below a threshold are insufficient to stimulate recording while recording beam intensities just beyond this threshold exhibit a high recording rate;
    wherein intensity of each recording beam is set above a recording threshold of the second optical medium while background noise intensity within the recorded second optical medium remains below this threshold, making that the second optical medium is recorded with a high contrast ratio.

7. The improvement to the generating and the using of a optical hologram according to claim 6
    wherein the hologram is recording information is within a dye-doped photopolymer medium exhibiting the highly non-linear recording characteristics.

8. The improvement to the generating and the using of a optical hologram according to claim 1
    wherein the m separate reference beams as do redundantly generate the master hologram are used in recording information in each of the n layers of the volume of the blank second optical medium.

9. In a method including
    generating in a first optical medium a master hologram containing information to be placed within the volume of a second optical medium, and then
    using the generated master hologram to record the information within multiple layers of the three dimensional volume of a blank second optical medium,
    an improvement wherein the generating comprises:
        redundantly generating the master hologram in the first optical medium by use of a plurality m of separate reference beams, each beam bearing information suitably recorded in one or more of a plurality n layers of the second optical medium; and wherein the using comprises:

simultaneously illuminating the generated master hologram with all of m reference beams so as to produce a corresponding m recording beams; and using the m recording beams in each of the n layers of the blank optical medium resulting in a total of m×n reference beams being directed to record all the multiple layers of the three dimensional volume of the second optical medium.

10. A method of producing in a first optical medium a master hologram containing information suitably imaged into multiple bit-oriented layers within a volume space of a second optical medium, thus a master hologram suitable for holographic stamping of multi-layer bit oriented optical medium, the method comprising:

generating in the first optical medium a master hologram by use of a plurality m of distinct reference beams, each beam bearing information that is suitably recorded in one or more of a plurality n layers of the second optical medium;

wherein, as well as the information, each beam produces, innately to its distinction from all other beams, characteristics of the master hologram that identify in which one or more of a plurality n layers of the second optical medium the information is so suitably recorded;

wherein, as is conventional for a hologram, the hologram contains both information and all spatial locations of the information;

wherein the hologram is distinguished for containing information that is layered and, equivalently, layers that contain information.

11. The method of generating an optical hologram suitable for holographic stamping of multi-layer bit oriented optical medium according to claim 10 wherein the generating is by use of a plurality m of different reference beams.

12. The method of generating an optical hologram suitable for holographic stamping of multi-layer bit oriented optical medium according to claim 11 wherein the generating is by use of a plurality m of reference beams that differ in angular separation.

13. The method of generating an optical hologram suitable for holographic stamping of multi-layer bit oriented optical medium according to claim 11 wherein the generating is by use of a plurality m of reference beams that differ by being incoherent.

14. An optical master hologram produced by the method according to claim 10.

15. A method of holographically stamping a multi-layer bit-oriented optical medium, the method comprising:

recording information within a plurality n layers of the volume of the blank optical medium with m separate-recording beams produced by simultaneously illuminating a master hologram with all of the m reference beams simultaneously;

wherein the recorded optical medium exhibits highly non-linear recording characteristics sufficient so that a recording beam holographically focused to a layer possesses intensity sufficient to write the layer while the cumulative intensities at all layers arising from the collective beams not focused to that layer remain insufficient to write the layer;

wherein the entire optical medium may be optically written, or stamped, in its multi-layer three dimensional volume at one time.

16. The method of holographically stamping a multi-layer bit-oriented optical medium according to claim 15 wherein the recording is by use of a plurality m of separate reference beams that are different by being mutually incoherent.

17. The method of holographically stamping a multi-layer bit-oriented optical medium according to claim 15 wherein the recording-is by use of a plurality m of separate reference beams that are different by being angularly separated.

18. The method of holographically stamping a multi-layer bit-oriented optical medium according to claim 15 wherein the recording is within a first optical medium exhibiting highly non-linear recording characteristics, beam intensities below a threshold being insufficient to write the medium while beam intensities just beyond this threshold are sufficient to write the medium;

wherein a recording beam holographically focused to a layer possesses intensity sufficient to write the layer while the cumulative intensities at all layers arising from the collective beams not holographically focused to that layer remain insufficient to write the layer.

19. The method of holographically stamping a multi-layer bit-oriented optical medium according to claim 18 wherein the recording is within a dye-doped photopolymer medium exhibiting the highly non-linear recording characteristics.

20. An optical hologram suitable to holographically stamp a multi-layer bit-oriented first optical medium, the optical hologram CHARACTERIZED IN THAT information within the optical hologram is organized for bit-oriented recording of another multiple layers within the three-dimensional volume of another, second, optical medium; and the optical hologram has been generated by use of a plurality m of separate reference beams, each beam bearing information suitably recorded in one or more of a plurality n layers of the second optical medium that are distinct from layers in which information in all other beams is suitably recorded.

21. The optical hologram according to claim 20 FURTHER CHARACTERIZED IN THAT the optical hologram has been generated by use of m separate reference beams that differ in angular separation.

22. The optical hologram according to claim 20 FURTHER CHARACTERIZED IN THAT the optical hologram has been generated by use of m separate reference beams that differ by being mutually incoherent.

23. The optical hologram according to claim 20 FURTHER CHARACTERIZED IN THAT the optical hologram is suitably redundantly illuminated by the same m separate reference beams in order to record each of the n layers of the volume of the blank second optical medium.

24. The optical hologram according to claim 20 FURTHER CHARACTERIZED IN THAT the optical hologram is suitably redundantly illuminated by a different m reference beams in order to record each of the n layers of the volume of the blank second optical medium.

25. A multi-layer bit-oriented information-containing volume optical memory CHARACTERIZED IN THAT the memory was made by data stamping all the information that is within the memory into all the multiple layers thereof at the same time and, as a consequence of this data stamping, the memory is now optically readable in layers each layer by a plurality of reference beams so many in number as there are layers.

26. The multi-layer bit-oriented information-containing volume optical memory according to claim 25 FURTHER CHARACTERIZED IN THAT the memory was made by use of a plurality m of separate reference beams, each beam bearing information that was recorded in one or more of a plurality n layers of an optical medium of the memory.

27. The multi-layer bit-oriented information-containing volume optical memory according to claim 25 FURTHER CHARACTERIZED IN THAT the memory was made by use of a plurality m of separate reference beams that differ in angular separation.

28. The multi-layer bit-oriented information-containing volume optical memory according to claim 25 FURTHER CHARACTERIZED IN THAT the optical hologram has been generated by use of m separate reference beams that differ by being mutually incoherent.

29. The multi-layer bit-oriented information-containing volume optical memory according to claim 25 FURTHER CHARACTERIZED IN THAT the memory is suitably redundantly illuminated by a same m separate reference beams in order to read each of n layers within the volume of the memory.

30. The multi-layer bit-oriented information-containing volume optical memory according to claim 25 FURTHER CHARACTERIZED IN THAT the memory is suitably redundantly illuminated by a different m reference beams in order to record each of the n layers within the volume of the memory.

\* \* \* \* \*